United States Patent
Lee et al.

(10) Patent No.: US 8,269,112 B2
(45) Date of Patent: Sep. 18, 2012

(54) FLEXIBLE CIRCUIT STRUCTURE

(75) Inventors: Yuan-Chang Lee, Taoyuan County (TW); Yu-Hua Chen, Nantou County (TW); Ying-Ching Shih, Changhua County (TW); Cheng-Ta Ko, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 766 days.

(21) Appl. No.: 12/189,206

(22) Filed: Aug. 11, 2008

(65) Prior Publication Data
US 2009/0173529 A1 Jul. 9, 2009

(30) Foreign Application Priority Data
Jan. 9, 2008 (TW) .............................. 97100866 A

(51) Int. Cl.
*H05K 1/00* (2006.01)
*H05K 1/09* (2006.01)

(52) U.S. Cl. ........ 174/254; 361/750; 361/762; 174/256; 174/251; 174/260

(58) Field of Classification Search .......... 174/250–268; 361/748–804
See application file for complete search history.

(56) References Cited

U.S. PATENT DOCUMENTS

| | | | | |
|---|---|---|---|---|
| 2,997,521 | A * | 8/1961 | Dahlgren | 174/254 |
| 5,569,886 | A * | 10/1996 | Tanabe et al. | 174/260 |
| 6,215,166 | B1 * | 4/2001 | McDunn et al. | 257/467 |
| 6,307,446 | B1 | 10/2001 | Drapeau et al. | |
| 6,714,431 | B2 * | 3/2004 | Gamini et al. | 365/51 |
| 6,743,982 | B2 | 6/2004 | Biegelsen et al. | |
| 7,465,678 | B2 * | 12/2008 | Bhattacharya et al. | 438/780 |
| 7,626,248 | B2 * | 12/2009 | Gamini et al. | 257/663 |
| 7,834,424 | B2 * | 11/2010 | Peumans et al. | 257/618 |
| 2002/0053464 | A1 * | 5/2002 | Schreiber et al. | 174/250 |
| 2004/0055776 | A1 | 3/2004 | Milijasevic | |
| 2004/0113250 | A1 * | 6/2004 | Khandros et al. | 257/680 |
| 2004/0192082 | A1 | 9/2004 | Wagner et al. | |
| 2004/0238819 | A1 | 12/2004 | Maghribi et al. | |
| 2004/0243204 | A1 | 12/2004 | Maghribi et al. | |
| 2005/0280157 | A1 | 12/2005 | Roush et al. | |
| 2009/0288860 | A1 * | 11/2009 | Lin | 174/254 |

FOREIGN PATENT DOCUMENTS
WO 03021679 3/2003
* cited by examiner

*Primary Examiner* — Zachary M Pape
(74) *Attorney, Agent, or Firm* — Jianq Chyun IP Office

(57) ABSTRACT

A circuit structure and a fabrication method thereof manly use a plurality of wires to connect in series a plurality of pads to form a stretchable circuit. Each of the wires has a first end, a second end and an intermediate segment located between the first end and the second end, wherein the first end and the second end are respectively connected to different pads, and the position of the intermediate segment is higher than the positions of the first end and the second end. Since the connection manner of the wires and the pads has 3-D freedoms, the circuit structure can withstand both horizontal and vertical deformations and has an outstanding reliability.

14 Claims, 10 Drawing Sheets

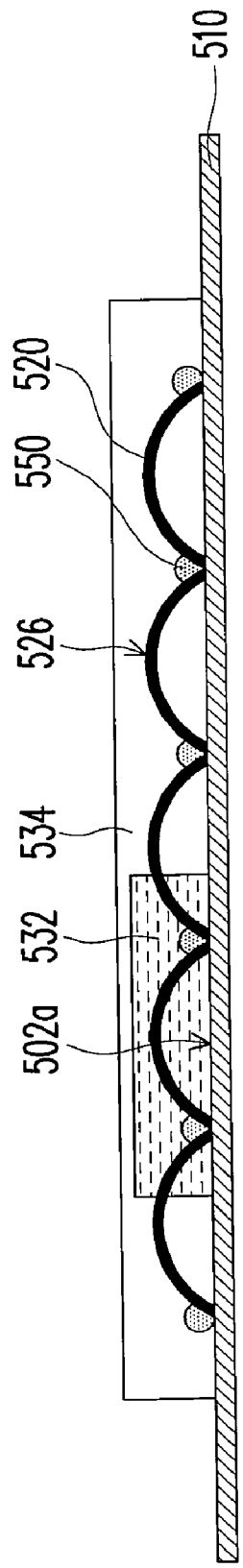
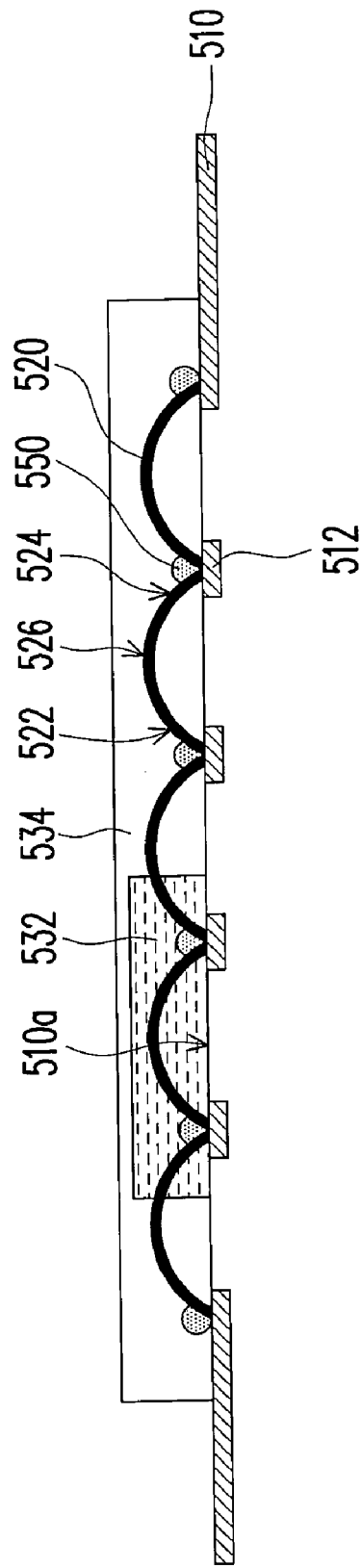
FIG. 6D
FIG. 6E

FLEXIBLE CIRCUIT STRUCTURE

CROSS-REFERENCE TO RELATED APPLICATION

This application claims the priority benefit of Taiwan application serial no. 97100866, filed on Jan. 9, 2008. The entirety of the above-mentioned patent application is hereby incorporated by reference herein and made a part of this specification.

BACKGROUND OF THE INVENTION

1. Field of the Invention

The present invention relates to a stretchable circuit structure and the fabrication method thereof.

2. Description of Related Art

Along with a developing trend for electronic products to combine light-thin-short-small appearance design with the flexible electronic technology, some flexible electronic products, such as E-paper, flexible display, have be available on the market, wherein the circuits are mostly fabricated on a flexible substrate so as to comply with bending and pulling effects. However, in comparison with a product with a traditional rigid substrate and a better structure strength, the flexible substrate obviously can not support a circuit structure with sufficient structure strength. In particular, when a bending operation or a pulling operation is applied to a flexible electronic product, the circuit located on the flexible substrate may suffer stresses to get damage. Therefore, a circuit employed by a flexible electronic product must be particularly designed in consideration of structure strength issue including altering the material of the circuit so as to meet the reliability requirement on a flexible electronic product.

U.S. Pat. No. 6,743,982 provides a circuit structure fabricated with a polymeric metal material, wherein the different stress gradients of different metal material enables a completed circuit to be bending deformed and to form winding, which make the circuit stretchable. US Patent Application No. 20040192082 provides a fabrication method that a circuit layer is deposited on a flexible substrate with a pull pre-load. Thereafter, the pull load on the substrate is released so as to make the circuit on the flexible substrate become wave-shape and stretchable. In addition, US Patent Application No. 20040243204 provides a circuit directly deposited on a flexible substrate and having wave-shape or serrated-shape so as to take advantage of the figure change of the circuit itself to enhance the horizontal and vertical allowable pull strengths.

SUMMARY OF THE INVENTION

Accordingly, the present invention is directed to a circuit structure with stretch ability to ensure the circuit having good reliability to withstand an external action.

The present invention is also directed to a method of fabricating a circuit structure able to fabricate a stretchable circuit structure to promote the usage reliability thereof.

The present invention provides a circuit structure, which mainly includes a flexible substrate, a plurality of pads and a plurality of wires. The pads herein are disposed on the flexible substrate. Each of the wires has a first end, a second end and an intermediate segment located between the first end and the first end, wherein the first end and the second end are respectively connected to different pads, and the distance between the intermediate segment and the flexible substrate is greater than any one of the distance between the first end and the flexible substrate and the distance between the second end and the flexible substrate.

The present invention also provides a method for fabricating a circuit structure: first, providing a flexible substrate and forming a plurality of pads on the flexible substrate; next, disposing a plurality of wires between the above-mentioned pads, wherein each wire has a first end, a second end and an intermediate segment located between the first end and the second end, the first end and the second end are respectively connected to different pads and the distance between the intermediate segment and the flexible substrate is greater than any one of the distance between the first end and the flexible substrate and the distance between the second end and the flexible substrate.

The present invention further provides another circuit structure, which mainly includes a pattern layer, a plurality of wires and a packaging layer. The pattern layer is hollowed out to form a plurality of pads. Each of the wires has a first end, a second end and an intermediate segment located between the first end and the first end, wherein the first end and the second end are respectively connected to different pads, and the distance between the intermediate segment and the pattern layer is greater than any one of the distance between the first end and the pattern layer and the distance between the second end and the pattern layer. In addition, the packaging layer encloses at least the wires and a plurality of joints of each wire and the corresponding pad.

The present invention further provides a method for fabricating a circuit structure: first, providing a plate and forming a plurality of wires on the plate, wherein each of the wires has a first end, a second end and an intermediate segment located between the first end and the second end, the first end and the second end are respectively connected to the plate and the distance between the intermediate segment and the plate is greater than any one of the distance between the first end and the plate and the distance between the second end and the plate; next, forming a first flexible packaging layer at a side of the plate to enclose at least the wires; then, patterning the plate to form a pattern layer having a plurality of pads, wherein the pattern layer exposes a part of the first flexible packaging layer, and the first end and the second end of each wire are respectively connected to different pads.

In the above-mentioned another circuit structure of the present invention, a device can be disposed, wherein the device is disposed at another different side of the pattern layer from the side the wires locate at, and the device is electrically connected to at least a part of the pads to form a circuit structure with an embedded device.

The present invention further provides another method for fabricating a circuit structure with an embedded device: first, providing a plate and disposing a plurality of wires on the plate, wherein each of the wires has a first end, a second end and an intermediate segment located between the first end and the second end, the first end and the second end are respectively connected to the plate and the distance between the intermediate segment and the plate is greater than any one of the distance between the first end and the plate and the distance between the second end and the plate; next, forming a first protective material block at a device jointing region of the plate, wherein the first protective material block and the wires are located at a same side of the plate and the protective material block encloses a part of the wires; then, forming a first flexible material block at a position other than the device jointing region of the plate, wherein the first flexible material block and the wires are located at a same side of the plate and the hardness of the first protective material block is greater than the hardness of the first flexible material block to provide the device with a better protection; after that, patterning the plate to form a pattern layer having a plurality of pads, wherein the pattern layer exposes a part of the first protective material block and the first flexible material block, and the first end and the second end of each wire are respectively connected to different pads; further, disposing a device at the device jointing region of the plate, wherein the device and the first protective material block are respectively located at a side opposite to another of the pattern layer and the device is electrically connected to at least a part of the pads.

Based on the above described, the circuit structure of the present invention uses wires to connect in series a plurality of pads so as to form a stretchable circuit, wherein since the wires connect the pads in 3-D freedoms, therefore, the circuit structure can withstand both horizontal and vertical deformations and provide a more outstanding reliability than the prior art.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 6A-6H are diagrams showing the steps of a method for fabricating the circuit structure of FIG. 5.

DESCRIPTION OF THE EMBODIMENTS

Figure 1:
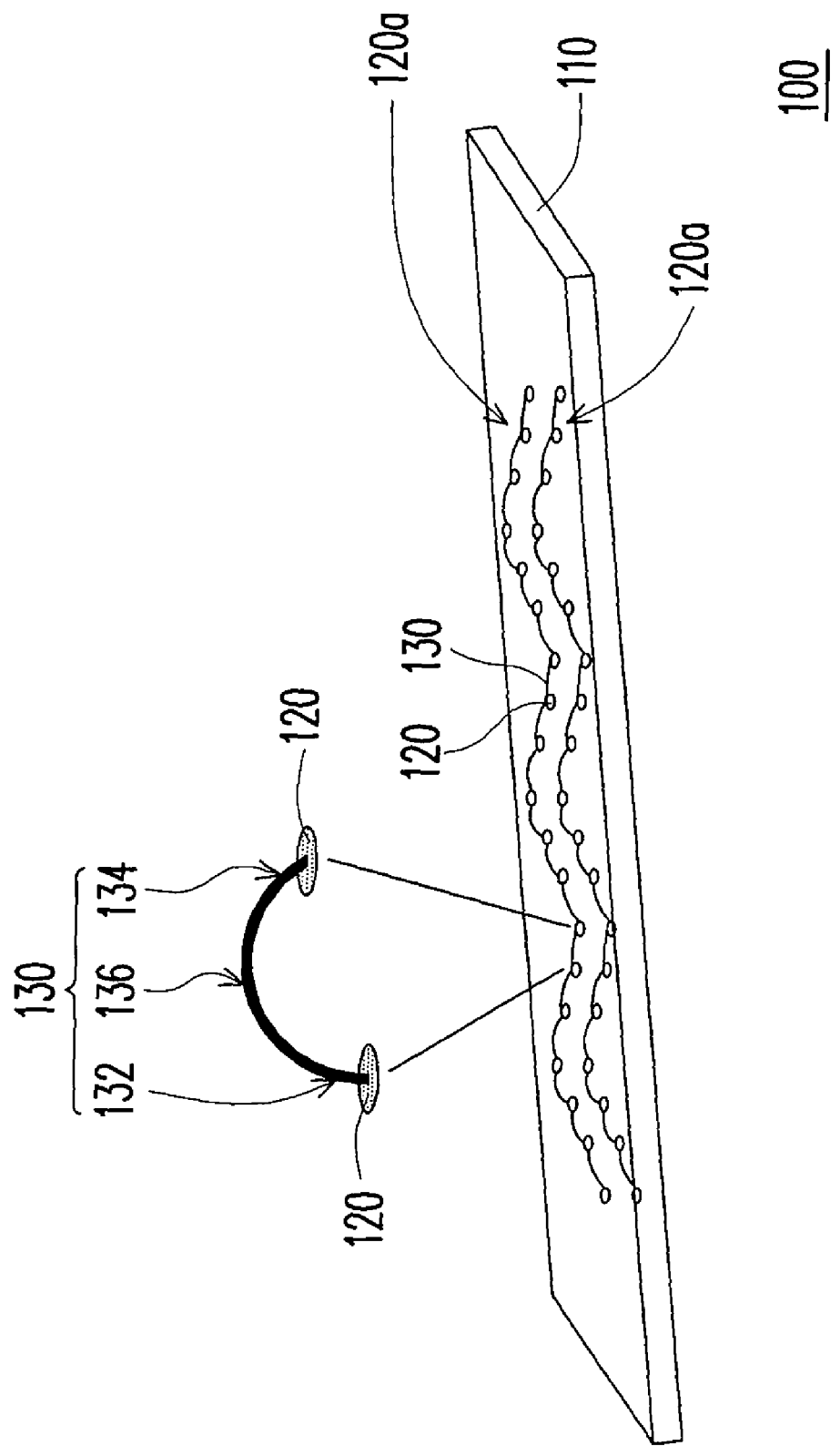
FIG. 1 is a diagram of a circuit structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of a circuit structure according to an embodiment of the present invention. Referring to FIG. 1, a flexible substrate 110 of the embodiment is made of, for example, polyimide (PI) or polydimethylsiloxane (PDMS), and a plurality of pads 120 is fabricated on the flexible substrate 110. A plurality of wires 130 are used for connecting different the pads 120 to form a circuit structure 100. Since one of the wires 130 uses a first end 132 and a second end 134 thereof to connect different pads, therefore, an intermediate segment 136 of the wire 130 would be suspended over the flexible substrate 110, namely the distance between the intermediate segment 136 and the flexible substrate 110 is greater than the distances between the first end 132 and second end 134. In this way, the circuit structure 100 formed by connecting the wires 130 to the pads 120 has a 3-D ductile margin, can withstand both horizontal and vertical deformations and thereby has a better usage reliability.

Figure 2B:
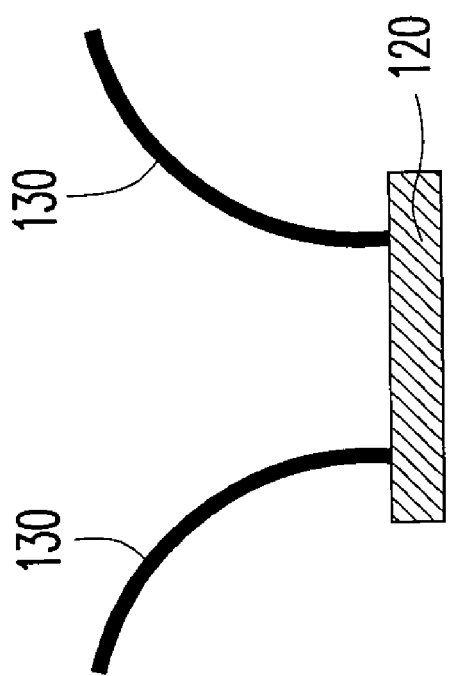
FIGS. 2A and 2B are diagrams showing two connection ways of two wires and a pad according to an embodiment of the present invention.
Figure 2A:
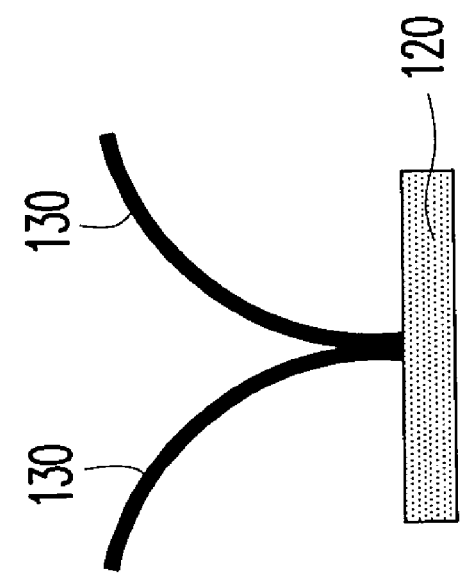

In the embodiment, the pads 120 are made of conductor or non-conductor, and the connection manner of the wires 130 is different depending on the different conductivity of the pads 120. For example, as shown in FIG. 2A, if the pads 120 are made of non-conductor, the ends of two wires 130 connected to a same pad 120 must be directly contacted each other to achieve electrical connection. However, in other embodiments, another conductive material can be formed on each of the pads 120, where there is no need to directly connect the two adjacent wires 130. In addition, as shown in FIG. 2B, if the material of the pad 120 itself is conductor, the two wires 130 connecting a same pad 120 can be electrically connected to each other through the pad 120, wherein there is no direct contact at all; nevertheless, two wires 130 connected to the same pad are allowed to be directly contacted as shown in FIG. 2A.

To fabricate the circuit structure 100 in the embodiment, first, pads 120 are formed on a flexible substrate 110 by using conventional processes, for example, printing process. Then, wires 130 are disposed between the pads 120 to connect different pads 120. In addition, if the pads 120 are made of metal, the pads can be formed on the flexible substrate 110 by using metal sputtering, yellow-light lithography and etching process.

The pads 120 in the embodiment can be arranged, for example, on the flexible substrate 110 into a plurality of pad strings 120a, and the pads of each the pad string 120a are sequentially connected in series by the corresponding wires 130 to compose a circuit, wherein in order to further increase the horizontal ductile margin of the circuit, the pads 120 of a pad string 120a can be arranged along a curve line segment, a serrated line segment or arranged in a pattern with a similar effect.

Besides, the method of disposing the wires 130 in the embodiment is, for example, conducting a wire bonding process or a pressing-fixing-node process. In this way, the wires 130 having curve radian and intermediate segments suspended over the flexible substrate 110 are formed.

Since the above-mentioned processes of fabricating the pads and disposing the wires are the known technology, they are omitted to describe. Anyone skilled in the art should understand the said processes and use them to fabricate the circuit structure 100 after referring the instruction of the above described.

In fact, the above-mentioned embodiment uses wires to connect in series a plurality of pads to form a stretchable circuit structure. Due to the 3-D freedoms of the connections between the wires and the pads, the circuit structure is able to withstand both horizontal and vertical deformations and thereby has a better usage reliability.

Based on the same idea, the present invention further includes other types of a circuit structure described hereinafter.

Figure 3:
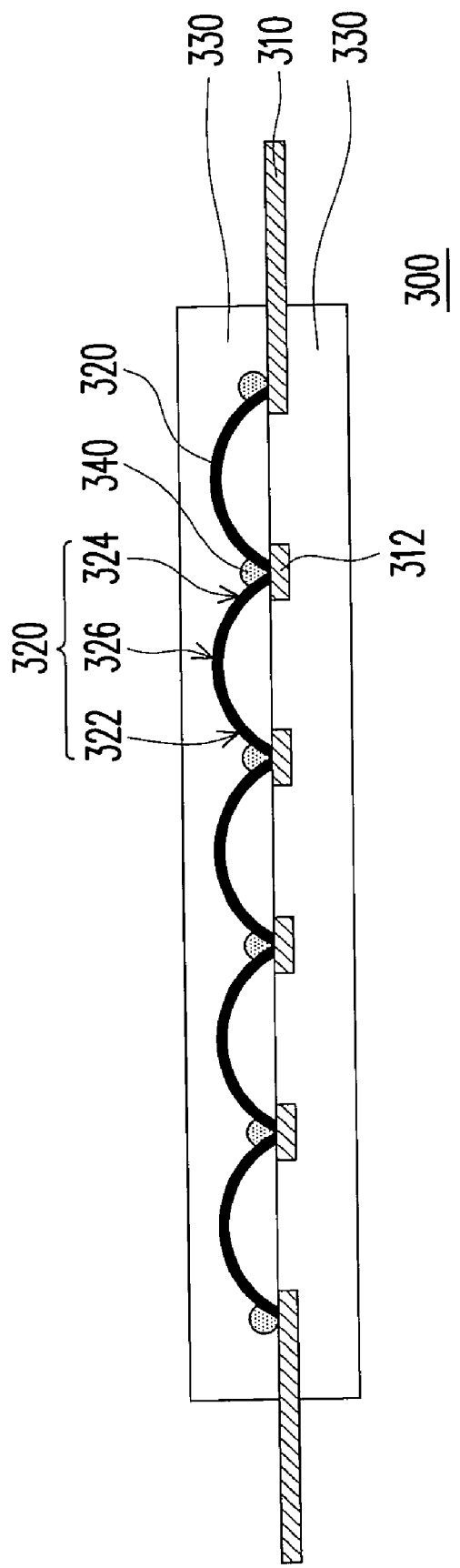
FIG. 3 is a diagram of a circuit structure according to another embodiment of the present invention.

FIG. 3 is a diagram of a circuit structure according to another embodiment of the present invention. Referring to FIG. 3, a circuit structure 300 includes a pattern layer 310, a plurality of wires 320 and a packaging layer 330. The pattern layer 310 is hollowed out into a plurality of pads 312 and the wires 320 are for connecting the pads 312. In the embodiment, each of the wires 320 has a first end 322, a second end 324 and an intermediate segment 326 located between the first end 322 and the second end 324, wherein the first end 322 and the second end 324 are respectively connected to different pads 312 and the intermediate segment 326 is suspended over the pattern layer 310. In more detail, the distance between the intermediate segment 326 and the pattern layer 310 is greater than the distances between the first end 322 and second end 324 and the pattern layer 310, so that the circuit by connecting the wires 320 to the pads 312 has a 3-D ductile margin and can withstand both horizontal and vertical deformations, and the circuit structure 300 thereby has a better usage reliability. In addition, in order to protect the wires 320 and the pads 312, a packaging layer 330 is disposed on the pattern layer 310 and encloses the wires 320 and the joints of the wires 320 and the corresponding pads 312.

In the embodiment, the packaging layer 330 is located at a side having the wires 320 of the pattern layer 310, or as shown in FIG. 3, the packaging layer 330 is composed of a first flexible packaging layer 332 and a second flexible packaging layer 334 respectively located at a side of the pattern layer 310 opposite to each other so as to completely enclose the pads 312 and the wires 320 and provide a stretchable effect. The above-mentioned first flexible packaging layer 332 and second flexible packaging layer 334 can be made of a same material of different materials, and the employed material includes a stretchable material, such as polydimethylsiloxane (PDMS), polyurathane (PU), thermo-plastic polyurathane (TPU), polyvinyl chloride (PVC) or polyimide (PI).

On the other hand, to enhance the jointing effect between the wires 320 and the corresponding pads 312, the embodiment further disposes a jointing material 340 at the joint between each of the wires 320 and each of the corresponding pads 312, wherein the jointing material 340 can be enclosed in the packaging layer 330, and the material of the jointing material 340 is, for example, epoxy adhesive, acrylate adhesive, silicone adhesive or polyurathane adhesive.

Similarly to the above-mentioned embodiment, the material of the pattern layer 310 can be conductor or non-conductor, and the connection of two adjacent wires 320 can be implemented by directly contacting or by indirectly connecting through a pad 312. The pads 312 of a pad string can be arranged along curve line segments, serrated line segments or arranged in a pattern with a similar effect so as to further enhance the horizontal ductile margin of the circuit.

To further express the above mentioned of the present embodiment, a method for fabricating a circuit structure 300 is depicted hereinafter. FIGS. 4A-4E are diagrams showing the steps of a method for fabricating the circuit structure of FIG. 3.

Figure 4A:
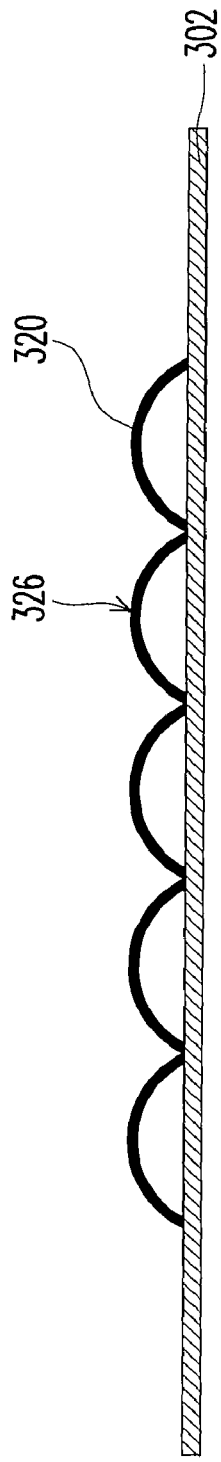
FIGS. 4A-4E are diagrams showing the steps of a method for fabricating the circuit structure of FIG. 3.

First referring to FIG. 4A, a plate 302 is provided and a plurality of wires 320 is disposed on the plate 302, wherein the plate is, for example, a sheet made of metal or other materials. The method for disposing the wires 320, as described as the above-mentioned embodiment, can be conducting a wire bonding process or a pressing-fixing-node process and so on so as to form the wires 130 having curve radian and the intermediate segments 326 suspended over the plate 302.

Figure 4B:
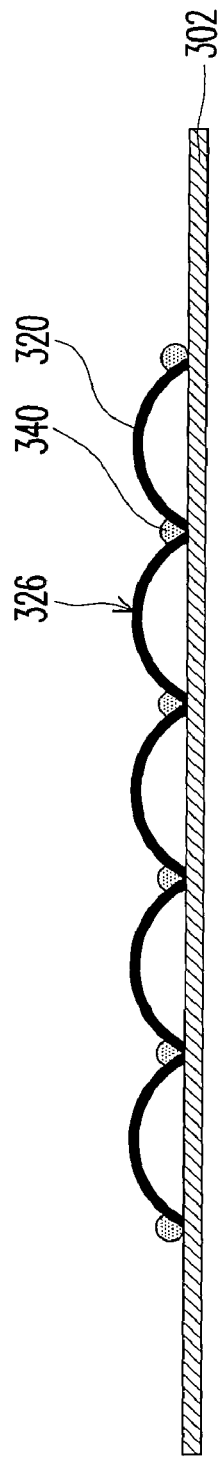

Next as shown in FIG. 4B, a jointing material 340 can be optionally formed at a joint of each the wire 320 and the plate 302 to enhance the jointing effect between the wires 320 and the plate 302.

Figure 4C:
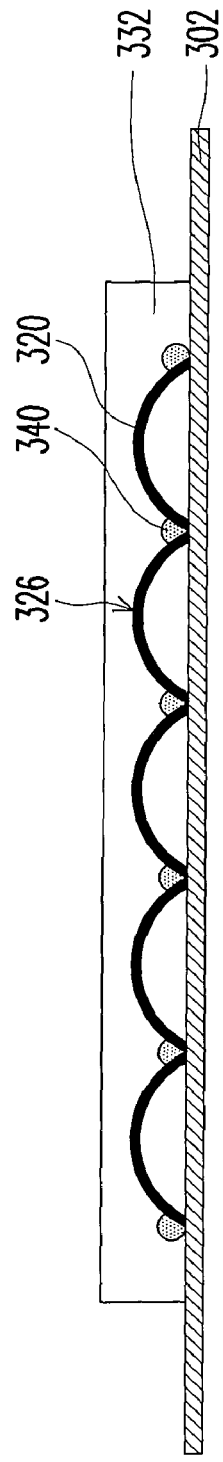
Figure 4D:
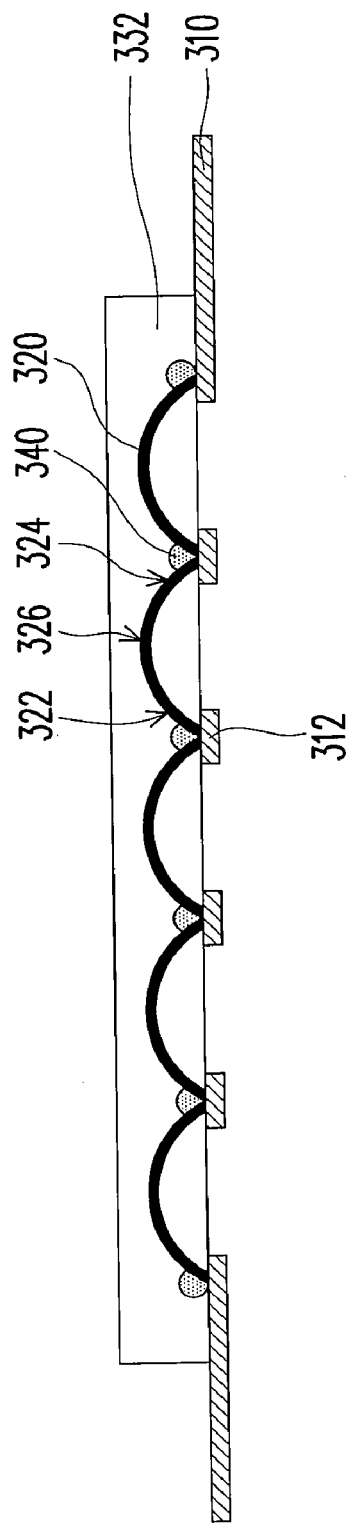

Then referring FIG. 4C, a first flexible packaging layer 332 is formed at a side of the plate 302 to enclose at least the wires 320. After that referring to FIG. 4D, the plate 302 is patterned by conducting an etching process to form a pattern layer 310 having the pads 312. Since the pattern layer 310 is locally hollowed out, a part of the first flexible packaging layer 332 is exposed. Further, the pads 312 are connected by the wires 320, wherein the first end 322 and the second end 324 of each the wire 320 are respectively connected to different pads 312.

Figure 4E:
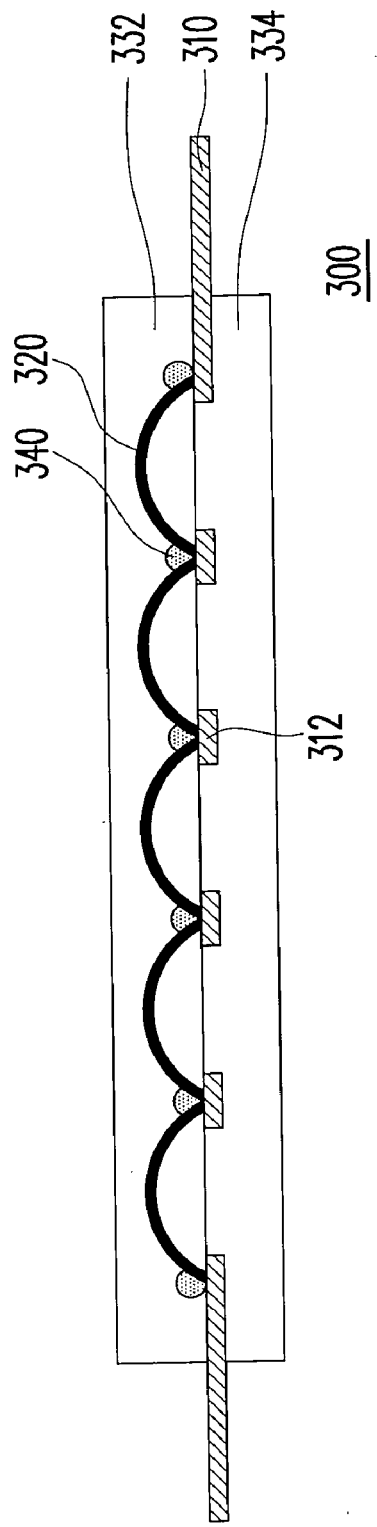

Further referring to FIG. 4E, the embodiment can optionally form a second flexible packaging layer 334 at another side of the pattern layer 310 so as to make the second flexible packaging layer 334 and the first flexible packaging layer 332 together enclose the pads 312, where the circuit structure 300 as shown in FIG. 3 is almost completed.

Figure 5:
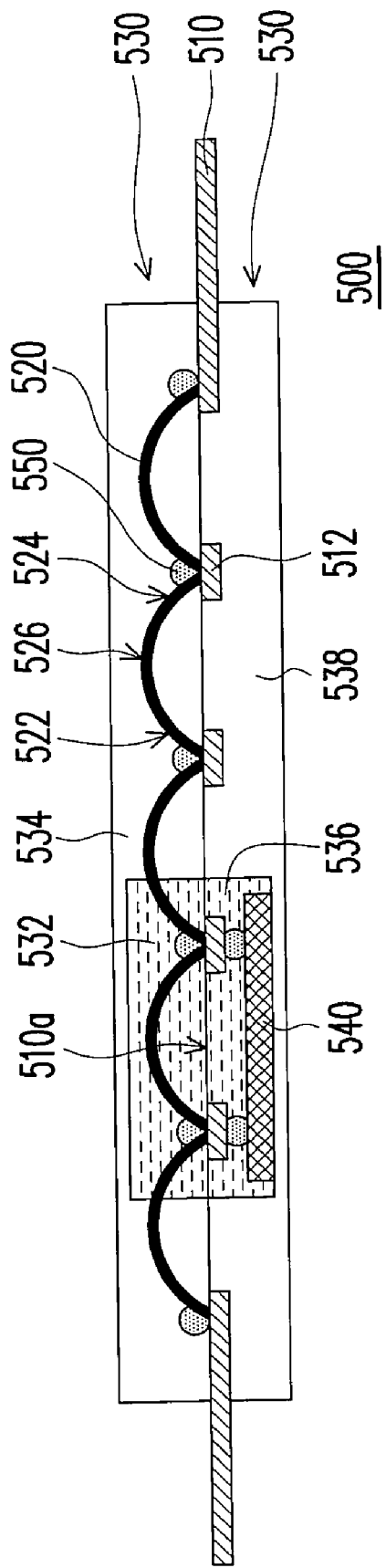
FIG. 5 is a diagram of a circuit structure with an embedded device according to yet another embodiment of the present invention.

FIG. 5 is a diagram of a circuit structure with an embedded device according to yet another embodiment of the present invention. Referring to FIG. 5, a circuit structure 500 includes a pattern layer 510, a plurality of wires 520, a packaging layer 530 and a device 540. The pattern layer 510 is hollowed out into a plurality of pads 512 and the wires 520 are for connecting the pads 512. In the embodiment, each of the wires 520 has a first end 522, a second end 524 and an intermediate segment 526 located between the first end 522 and the second end 524, wherein the first end 522 and the second end 524 are respectively connected to different pads, and the intermediate segment 526 is suspended over the pattern layer 510. Specially, the distance between the intermediate segment 526 and the intermediate segment 526 is greater than the distances between the first end 522 and second end 524 and the pattern layer 510, so that the circuit formed by connecting the intermediate segment 526 to the pads 512 has a 3-D ductile margin, can withstand both horizontal and vertical deformations and the circuit structure 500 thereby has better usage reliability. In addition, the device 540 is disposed on a device jointing region 510a and the device 540 and the wires 520 are respectively located at a side of the pattern layer 510 opposite to each other. The packaging layer 530 is disposed on the pattern layer 510 and encloses the wires 520, the pads 512 and the device 540 to provide a protection effect.

When the circuit structure 500 is pulled, the device 540 itself and the jointing strength thereof may be affected, considering which the embodiment can adjust the composition of the packaging layer. For example, a material with higher hardness is disposed at a region close to the device so as to provide the device with perfect protection. As shown in FIG. 5, the packaging layer 530 of the embodiment includes a first protective material block 532 and a first flexible material block 534, and both the first protective material block 532 and the first flexible material block 534 are disposed at the same side as the wires 520 of the pattern layer 510, wherein the first protective material block 532 is corresponding to the position of the device 540 to enclose a part of the pads 512 and the wires 520. The first flexible material block 534 is disposed on the pattern layer 510 at a position other than the first protective material block 532, and the hardness of the first protective material block 532 is greater than the hardness of the first flexible material block 534.

In the embodiment, the material of the first protective material block 532 is, for example, epoxy molding compound (EMC), underfill or acrylate. The material of the first flexible material block 534 is, for example, polydimethylsiloxane (PDMS), polyurathane (PU), thermoplastic polyurathane (TPU), polyvinyl chloride (PVC) or polyimide (PI).

The packaging layer 530 of the embodiment can be disposed at both sides of the pattern layer 510; namely, the packaging layer 530 can further include a second protective material block 536 and a second flexible material block 538. The second protective material block 536 and the first protective material block 532 are corresponding to each other and disposed at both opposite sides of the pattern layer 510, wherein the second flexible material block 538 is corresponding to the first flexible material block 534, the second flexible material block 538 and the first flexible material block 534 are respectively located at both the opposite sides of the pattern layer 510, and the hardness of the second protective material block 536 is greater than the hardness of the second flexible material block 538.

In the embodiment, the material of the second protective material block 536 is the same as that of the first protective material block 532, for example, epoxy molding compound (EMC), underfill or acrylate. The material of the second flexible material block 538 can use the same material as that of the first flexible material block 534, for example, polydimethylsiloxane (PDMS), polyurathane (PU), thermo-plastic polyurathane (TPU), polyvinyl chloride (PVC) or polyimide (PI).

Similarly to the above-mentioned embodiment, in order to enhance the jointing effect between the wire 520 and the corresponding pad 512 in the embodiment, a jointing material 550 can be further disposed at a joint between each the wire 320 and the corresponding pad 512. The jointing material 550 can be enclosed in the packaging layer 530 and the material of the jointing material 550 is, for example, epoxy adhesive, acrylate adhesive, silicone adhesive or polyurathane adhesive.

The material of the pattern layer 510 can be conductor or non-conductor and two adjacent wires 520 are connected to each other by directly contacting or indirectly conducting through a pad 512. A plurality of pads 512 forms a pad string, and the pads are arranged along a curve line segment, a serrated line segment or arranged in a pattern with a similar effect.

To further depict the above-mentioned embodiment, a method for fabricating the above-mentioned circuit structure 500 is described hereinafter. Referring to FIGS. 6A-6H, they are diagrams showing the steps of a method for fabricating the circuit structure 500 of FIG. 5.

Figure 6A:
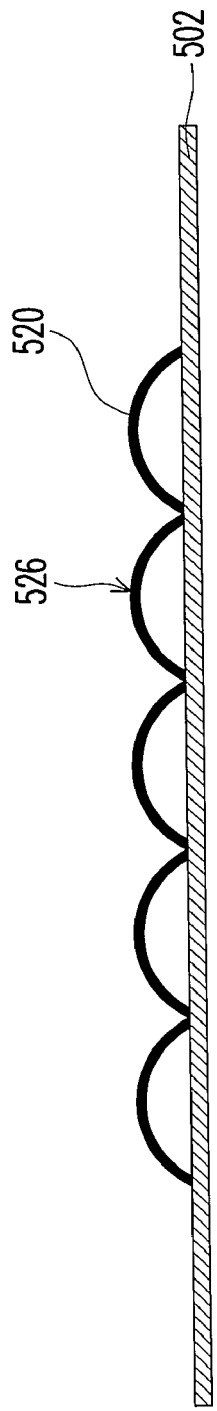

First referring to FIG. 6A, a plate 502 is provided and a plurality of wires 520 is disposed on the plate 502, wherein the plate is, for example, a sheet made of metal or other materials. The method for disposing the wires 520, as described as the above-mentioned embodiment, can be conducting a wire bonding process or a pressing-fixing-node process and so on so as to form the wires 520 having curve radian and the intermediate segments 526 suspended over the plate 502.

Figure 6B:
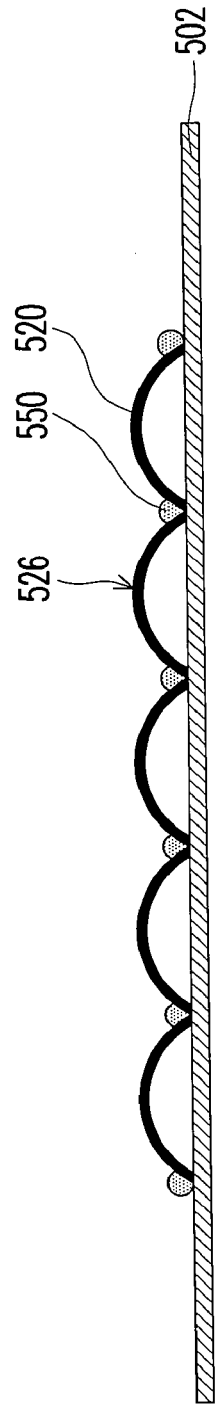

Next as shown in FIG. 6B, a jointing material 550 can be optionally formed at a joint of each the wire 520 and the plate 502 to enhance the jointing effect between the wires 520 and the plate 502.

Figure 6C:
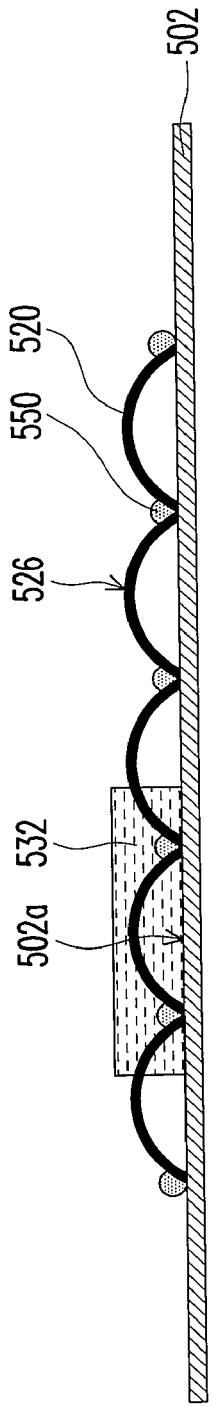

Then referring FIG. 6C, a first flexible packaging layer 532 is formed at a device jointing region 502a of the plate 502, wherein the first protective material block 532 and the wires 520 are at the same side of the plate 502 and the first protective material block 532 encloses a part of the wires 320.

After that referring to FIG. 6D, a first flexible material block 534 is formed on the plate 502 at a position other than the device jointing region 502a, wherein the first flexible material block 534 and the wires 520 are located at the same side of the plate 502, and the hardness of the first protective material block 532 is greater than the hardness of the first flexible material block 534.

Further referring to FIG. 6E, the plate 502 is patterned by conducting, for example, retching process. Since the pattern layer 510 is locally hollowed out, a part of the first protective material block 532 and the first flexible material block 534 is exposed. The pads 512 are connected to the wires 520, wherein the first end 522 and the second end 524 of each the wire 520 are respectively connected to different pads 512.

Figure 6F:
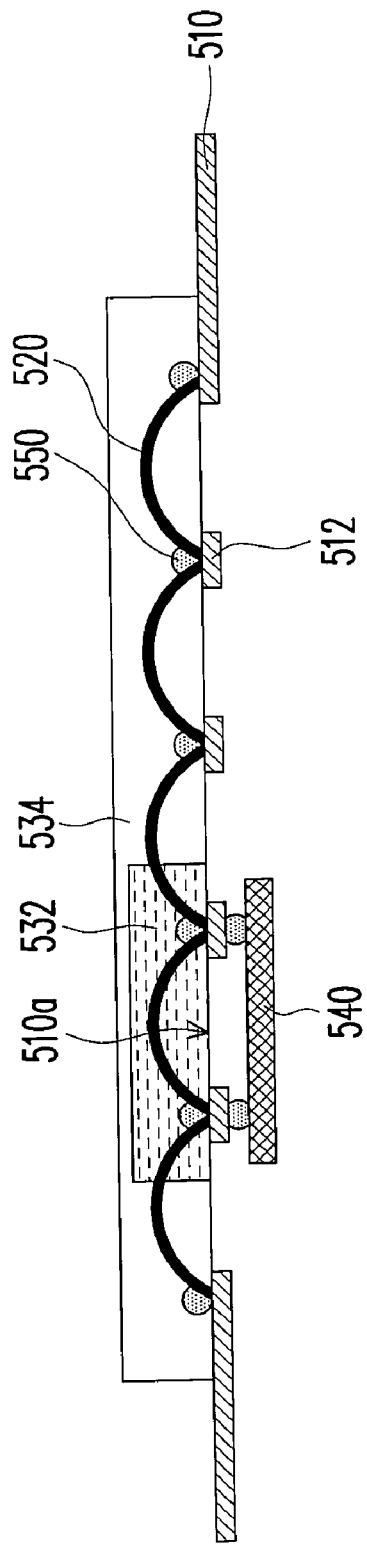

Furthermore referring to FIG. 6F, a device 540 is disposed at the device jointing region 510a of the pattern layer 510 (corresponding to the device jointing region 502a of the plate 502), wherein the device 540 and the first protective material block 532 are located at the two opposite sides of the pattern layer 510, and the device 540 is electrically connected to at least a part of the pads 512. The device applicable to the embodiment is, for example, a common embedded passive device or a common active device.

Figure 6G:
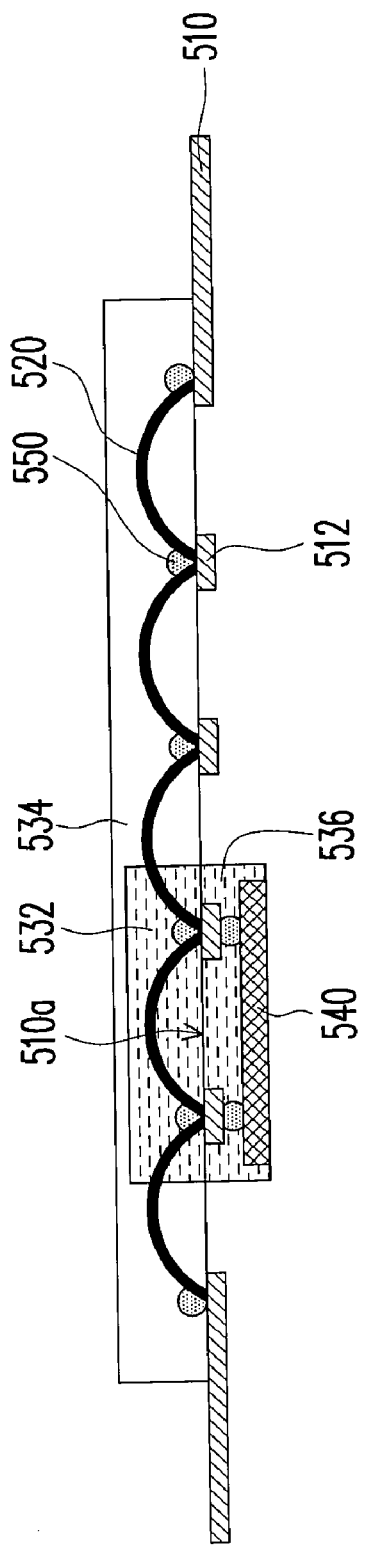

Furthermore referring to FIG. 6G, a second protective material block 536 is formed at the device jointing region 510a of the pattern layer 510. The second protective material block 536 and the first protective material block 532 are located at the two opposite sides of the pattern layer 510 to enclose the device 540, and the hardness of the second protective material block 536 is greater than the hardness of the first flexible material block 534.

Figure 6H:
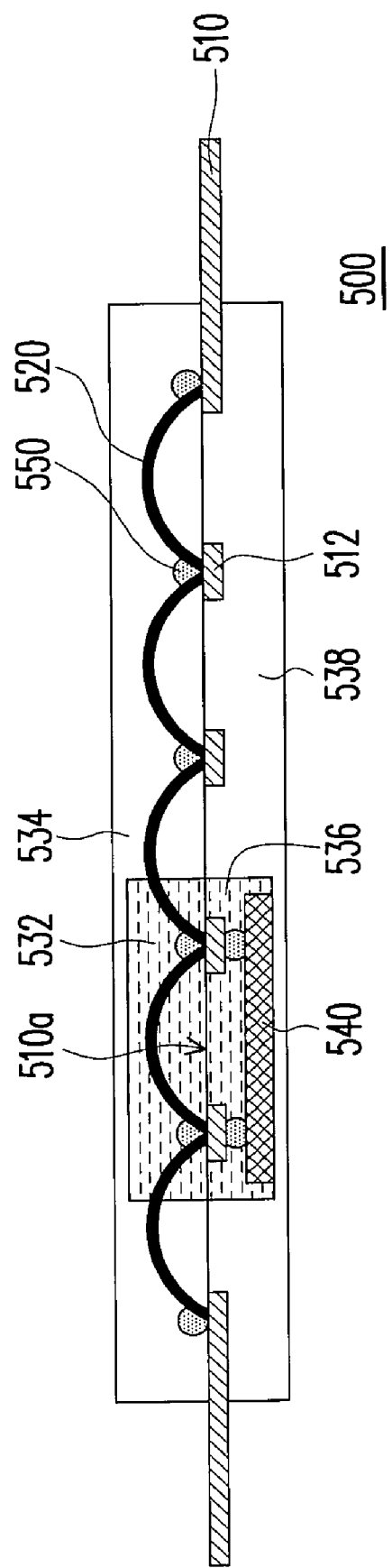

Moreover referring to FIG. 6H, a second flexible material block 538 is formed at a position other than the device jointing region 510a of the pattern layer 510. The second flexible material block 538 and the first flexible material block 534 are located at the two opposite sides of the pattern layer 510, and the hardness of the second protective material block 536 is greater than the hardness of the second flexible material block 538, where the circuit structure 500 of FIG. 5 is almost completed.

In summary, the present invention employs a plurality of pads in series connection to form a stretchable circuit, wherein the circuit structure can be different lightly depending on different fabrication methods, but still follow the above-mentioned design idea. For example, a stretchable circuit structure can be formed by employing a flexible substrate to directly support the pads and the wires; a stretchable circuit structure can be formed by using a plate (for example, a metal sheet) to fabricate a pattern layer having pads, followed by connecting the wires to the pads to form a packaging layer to enclose the wires and the pads as well. The present invention allows an embedded device to be disposed in the circuit structure and to enclose a material with higher strength at the region surrounding the device, so that the device keeps a safety status as the circuit structure is pulled. The connection way of the wires and the pads in the circuit structure of the present invention has 3-D freedoms, which ensures the circuit structure to withstand both horizontal and vertical deformations and to have better reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flexible circuit structure, comprising:
   a pattern layer to be deformed, the pattern layer being hollowed out into a plurality of pads;
   a plurality of wires, wherein each of the wires has a first end, a second end and an intermediate segment located between the first end and the second end, the first end and the second end are respectively connected to different pads, the distance between the intermediate segment and the pattern layer is greater than any one of the distance between the first end and the pattern layer and the distance between the second end and the pattern layer, and at least two wires of the plurality of wires are electrically connected together via the same pad to form a trace;
   a packaging layer, enclosing at least the wires and the joints of the wires and the corresponding pads; and
   a device, disposed at the other side of the pattern layer than the side the wires are located at, wherein the device is electrically connected to at least a part of the pads, wherein the packaging layer comprises a first protective material block and a first flexible material block, both of the first protective material block and the first flexible material block are disposed at the same side of the pattern layer as the wires, the first protective material block is corresponding to the position of the device to enclose the device and a part of the pads and the wires, the first flexible material block is disposed on the pattern layer at a position other than the first protective material block, and the hardness of the first protective material block is greater than the hardness of the first flexible material block.

2. The flexible circuit structure according to claim 1, wherein the material of the pattern layer comprises conductor or non-conductor.

3. The flexible circuit structure according to claim 1, wherein the pads comprise a pad string, the pads of the pad string are sequentially connected in series by the corresponding wires.

4. The flexible circuit structure according to claim 3, wherein a vertical projection of the pads on the substrate is curved or serrated.

5. The flexible circuit structure according to claim 1, wherein two wires connected to a same pad are connected to each other by directly contacting or indirectly connected to each other through the pad.

6. The flexible circuit structure according to claim 1, wherein the first flexible material block is disposed at the same side of the pattern layer as the wires so as to enclose the wire and the joints of the wires and the corresponding pads.

7. The flexible circuit structure according to claim 6, wherein the packaging layer further comprises a second flexible material block, and the first flexible material block and the second flexible material block are respectively located at the two opposite sides of the pattern layer so as to together enclose the pads.

8. The flexible circuit structure according to claim 7, wherein the material of the first flexible material block and the second flexible material block comprises polydimethylsiloxane (PDMS), polyurathane (PU), thermo-plastic polyurathane (TPU), polyvinyl chloride (PVC) or polyimide (PI).

9. The flexible circuit structure according to claim 1, further comprising a plurality of jointing materials, respectively disposed at a joint of each of the wires and the corresponding pad, and enclosed in the packaging layer.

10. The flexible circuit structure according to claim 1, wherein the material of the first protective material block comprises epoxy molding compound (EMC), underfill or acrylate.

11. The flexible circuit structure according to claim 1, wherein the material of the first flexible material block comprises polydimethylsiloxane (PDMS), polyurathane (PU), thermo-plastic polyurathane (TPU), polyvinyl chloride (PVC) or polyimide (PI).

12. The flexible circuit structure according to claim 1, wherein the packaging layer further comprises a second protective material block and a second flexible material block, wherein the second protective material block is corresponding to the first protective material block, the second protective material block and the first protective material block are respectively disposed at the two opposite sides of the pattern layer, the second flexible material block is corresponding to the first flexible material block, the second flexible material block and the first flexible material block are respectively located at the two opposite sides of the pattern layer, and the hardness of the second protective material block is greater than the hardness of the second flexible material block.

13. The flexible circuit structure according to claim 12, wherein the material of the second protective material block comprises epoxy molding compound (EMC), underfill or acrylate.

14. The flexible circuit structure according to claim 12, wherein the material of the second flexible material block comprises polydimethylsiloxane (PDMS), polyurathane (PU), thermo-plastic polyurathane (TPU), polyvinyl chloride (PVC) or polyimide (PI).

* * * * *